United States Patent [19]

Hollaar et al.

[11] Patent Number: 4,538,110

[45] Date of Patent: Aug. 27, 1985

[54] HIGH-STABILITY CLOCK SIGNAL REGENERATOR WITH A STABLE FIXED FREQUENCY BACKUP CLOCK GENERATOR

[75] Inventors: Leendert J. Hollaar, Zwolle; Herman Zoetman; Robert J. M. Verbeek, both of Hilversum, all of Netherlands

[73] Assignee: U.S. Philips Corporation, New York, N.Y.

[21] Appl. No.: 508,997

[22] Filed: Jun. 29, 1983

[30] Foreign Application Priority Data

Jul. 5, 1982 [NL] Netherlands .................. 8202685

[51] Int. Cl.³ ........................ H03K 5/135; H03K 5/26
[52] U.S. Cl. .................................... 328/63; 307/443; 307/528; 307/529; 307/269; 328/75; 328/134; 328/157
[58] Field of Search ............. 307/200 A, 443, 465, 307/480, 523–529, 269, 271; 328/60–63, 72, 75, 104, 134, 157, 164; 331/49

[56] References Cited

U.S. PATENT DOCUMENTS

| | | | |
|---|---|---|---|
| 3,865,981 | 2/1975 | Welch et al. | 307/443 X |
| 3,952,254 | 4/1976 | Kurita et al. | 328/164 X |
| 4,019,143 | 4/1977 | Fallon et al. | 328/61 X |
| 4,027,261 | 5/1977 | Laurent et al. | 307/480 X |
| 4,105,979 | 8/1978 | Kage | 328/164 |
| 4,239,982 | 12/1980 | Smith et al. | 307/269 X |
| 4,471,299 | 9/1984 | Elmis | 307/269 X |
| 4,480,198 | 10/1984 | Gass | 307/200 A X |

*Primary Examiner*—Stanley D. Miller
*Assistant Examiner*—D. R. Hudspeth
*Attorney, Agent, or Firm*—Thomas A. Briody; William J. Streeter

[57] ABSTRACT

A clock signal regenerator comprising a frequency control loop (1, 2, 3, 4) which comprises a variable-frequency clock signal generator (2) used in digital telephone exchanges, when a local clock signal must be generated from incoming clock signals (1-1, 1-N). The clock signal regenerator comprises a very stable auxiliary signal generator (9) and a first difference signal producer (11) for determining the frequency difference between the generated clock signal and the auxiliary signal. This frequency difference is determined periodically and written into a storage device (13). In addition, the regenerator comprises a second difference signal producer (14) in which the difference is determined between a new frequency difference determined in the first difference signal producer (11) and the preceding frequency difference stored in the storage arrangement (13). After the incoming clock signals (1-1, . . . 1-N) have dropped out the difference signal produced in the second difference signal producer (14) is applied as a control signal to the clock signal generator (2), and the content of the storage device (13) is not changed. This has the advantage that the stability of the clock signal regenerator is then the same as the stability of the auxiliary signal generator.

6 Claims, 1 Drawing Figure

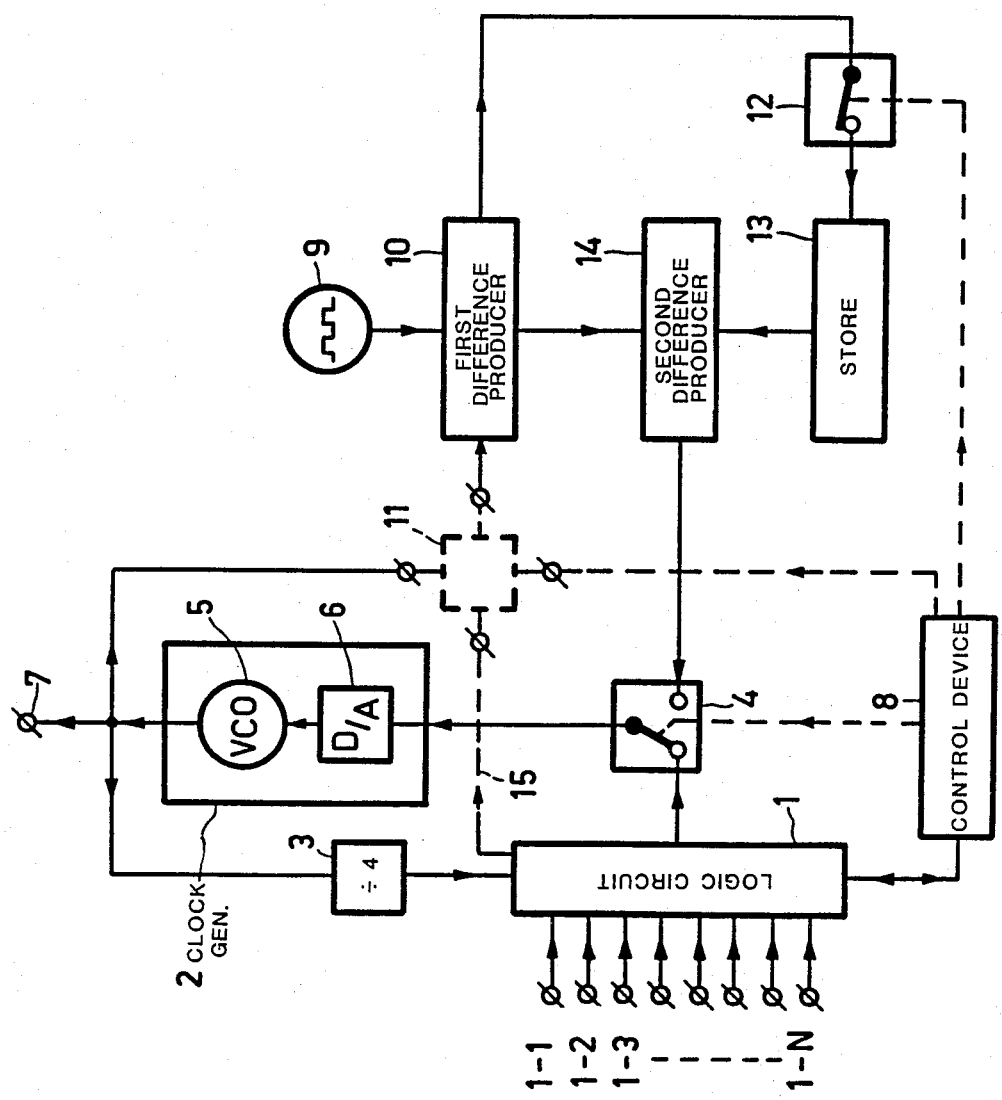

HIGH-STABILITY CLOCK SIGNAL REGENERATOR WITH A STABLE FIXED FREQUENCY BACKUP CLOCK GENERATOR

The invention relates to a clock signal regenerator comprising a clock signal generator whose frequency is controllable by a control signal. The clock signal generator is included in a control loop for synchronizing the frequency of the clock signal generated by the clock signal generator with an input signal applied to the control loop by means of a control signal derived from the frequency difference between the clock signal and the input signal.

Such a clock signal regenerator is generally known and is used in many fields of the art. Clock pulse regenerators are, for example, used in synchronous telecommunication systems, more specifically in digital exchanges of these systems. So as to mutually synchronize the exchanges in such a communication system with each other either a standard signal frequency of a common external source is applied or incoming clock pulse signals are derived from incoming PCM signals supplied by connected exchanges, which clock pulse signals are applied to the local clock signal generator for generating a local clock signal therefrom. The frequency of the clock signal generator included in the clock signal regenerator must be tunable so as to render it possible for a variation in the applied standard signal frequency or a change in a "weighted mean" clock signal frequency derived from the incoming clock signals to be followed.

On the other hand, such a clock signal generator must be very stable so as to be capable of independent operation during a certain period of time without the occurrence of an impermissible frequency variation, in the event that the incoming clock signal fails to arrive. For example, that when a trunk cable is broken during road repair operations the clock signal frequency must remain sufficiently stable for some days without a reference signal.

The conflicting requirements of a very high stability and the fact that the clock signal regenerator frequency must be tunable resulted in the use of complicated and consequently costly apparatus.

SUMMARY OF THE INVENTION

The invention has for its object the provision of a clock signal generator which is tunable and has a comparatively simple construction and which may be constructed to have a high stability.

To accomplish this object, according to the invention, the clock signal regenerator comprises an auxiliary signal generator for producing a fixed-frequency auxiliary signal. A first difference signal producer is connected to the auxiliary signal generator, to which at least the generated clock signal is applied in addition to the auxiliary signal to determine the frequency difference between the auxiliary signal and a signal which is proportional to the clock signal. A storage device is connected to the first difference signal producer for storing the determined frequency difference and, a second difference signal producer is connected to the first difference signal producer and to the storage device to determine the difference between the frequency difference stored in the storage device and a signal produced by the first difference producer which signal is proportional to the frequency difference between the auxiliary signal and the clock signal. A switching means is provided for applying in the absence of a reliable input signal the signal produced by the second difference signal producer as a control signal to the controllable clock signal generator.

The use of an auxiliary signal generator which produces an auxiliary signal with a fixed signal frequency, and of a store in which the difference between the frequency of the occurring clock pulse signal and the frequency of the auxiliary signal is stored has the advantage that after a reliable input signal has dropped out a very stable reference signal is available in a comparatively simple way.

By generating from this reference signal a control signal for controlling the variable-frequency clock signal generator, drift of the variable-frequency clock signal generator being compensated for, provides the advantage that the stability of the variable-frequency clock signal generator is determined by the stability of the auxiliary signal generator. A high stability of a fixed-frequency signal generator can however be realized in a much simpler way than for a variable-frequency generator. In addition, the manner in which the clock pulse generator in accordance with the invention is implemented has the advantage that simple logic circuits can be used, as comparatively small numbers are employed because of the fact that signals are used which represent frequency differences when signal processing operations must be performed.

DESCRIPTION OF THE FIGURE

The FIGURE is a block diagram of a preferred embodiment in accordance with the invention.

DESCRIPTION OF THE PREFERRED EMBODIMENT

The invention and its advantages will now be further described by way of example with reference to an embodiment shown in the accompanying FIGURE.

The clock signal generator shown in this FIGURE is, for example, used as a central clock in a digital telephone exchange. In order to have this telephone exchange operate in synchronism with exchanges connected thereto, the regenerator comprises a control loop (1, 2, 3, 4) to which a signal from an external standard clock is applied or to which clock signals are applied which are derived from incoming PCM bit streams. These clock signals, which have, for example, a frequency of approximately 2,048 KHz are applied to inputs 1—1 to 1-N, respectively of a logic circuit 1, which is included in the control loop. In addition, the control loop (1, 2, 3, 4) comprises a clock signal generator 2 having a clock signal frequency of, for example, approximately 8192 KHz, which is connected to the logic circuit 1 through a divide-by-4 divider 3. By means of a weighted sum of the incoming clock signals an input signal is derived in this logic circuit and the frequency difference is determined between this input signal and the clock signal generated by the clock signal generator 2. For that purpose the logic circuit comprises as many adding and subtracting devices as there are inputs N. Each of the circuits is connected to a separate additional input and the generated clock signal is applied to all the devices.

The counting position of each of these devices is increased one unit by each pulse of the incoming clock signal applied thereto and decreased by one unit by each pulse of the clock signal produced by the divider 3.

The frequency difference between each of the incoming clock signals and the generated clock signal is determined by reading the counting position of each of the counting devices after a predetermined period of time. The counting positions obtained are applied to an adder after each counting position has been separately multiplied by a weighting factor. The sum signal obtained is thereafter divided in a divider by a divisor equal to the sum of the weighting factor.

The numerical value thus obtained is a measure of the frequency difference between an input signal formed by the weighted average of the incoming clock signal and the generated clock signal. This numerical value is applied by a first switching device 4 of the first switching means (4, 12) to the clock signal generator 2 for adjusting the frequency difference to zero.

For that purpose the clock-signal generator 2 comprises a variable-frequency, voltage-controlled pulse oscillator 5 and a digital-to-analogue converter 6. The control signal is applied to the D/A converter 6, which applies to a control voltage which is proportional to the numerical value of the control signal to the voltage-controlled oscillator 5. Under the control of this control signal the frequency of the generated clock signal is set, which clock signal is supplied from output terminal 7.

The precision with which the frequency of the generated clock signal can be made equal to the frequency of the input signal depends on the precision with which the frequency difference is determined. So as to obtain a stable output signal the frequency difference must be measured at the above-mentioned clock signal frequency during a period of approximately 10 seconds. For the sake of simplicity of the counting devices, the frequency difference is determined every 4 milliseconds by the control device 8 and the 2500 frequency differences are averaged after 10 seconds.

The incoming clock signals or the standard signal from which the input signal is derived may drop out due to various causes, for example, due to a short-circuit in an underground cable. This causes no problems as long as an incoming clock signal is still intact. The incoming clock signals are supervised in a manner not shown, for example, by supervising the frequency difference determined every 4 milliseconds in each of the counting devices.

If in these 4 milliseconds a predetermined value is exceeded, the relevant incoming clock signal is switched off and the frequency difference measured is not added to the previous results. If, however, all the incoming clock signals disappear, for example, because an underground cable is destroyed during road repairs by an excavator, then the clock signal generator will have to bridge the period of time required to repair the cable. However, this may take some days. In order to prevent the frequency of the generated clock signal from drifting too much in that period due to temperature variations and ageing, a very stable clock signal generator must be used.

In order to obtain a high stability of the variable-frequency clock signal generator 2 an auxiliary signal generator 9 having a fixed signal frequency of, for example, 8,192 KHz and a sufficiently high stability is provided. Such a fixed-frequency generator is considerably cheaper than a variable-frequency generator having the same stability.

The auxiliary signal generator 9 is connected to a first difference producer 10 to which in a first embodiment the generated clock signal is continuously applied by second switching means 11. In this variant this second switching means 11 provide a fixed through-connection. In the first difference signal producer the frequency difference between the generated clock signal and the auxiliary signal is determined. For that purpose the difference signal producer 10 comprises a first adding and subtracting device to which the generated clock signal and the auxiliary signal are applied. Each pulse of one of these signals increases the counting position of this counting device by one unit and each pulse of the other signal decreases the counting position by one unit. The frequency difference determined in a given period of time of, for example, 20 seconds is applied in the form of a number to a store 13 through a second switching device 12 of the first switching means. The information stored in this store is overwritten by the number applied to it. Thus, the store always contains the frequency difference measured last. The difference signal produced in the first difference signal producer 10 is not only applied to the store 13 but also to a second difference signal producer 14. The store 13 is also connected to this second difference signal producer for applying thereto the signal stored in the store 13. The second difference signal producer takes the difference between the difference signals applied thereto continuously by means of a subtracting device.

When the disappearance of the input signal is detected, then the control device opens the normally-closed second switching circuit 12, as a result of which the last-determined frequency difference stored in the store 13 is not overwritten.

At the same time as the second switching device 12 switches, the control device adjusts the first switching device 4 to the position not shown. This causes on the one hand the control signal generated by the logic input circuit to be disconnected and on the other hand the difference signal produced in the second difference signal producer 14 to be applied as a control signal to the clock signal generator 2. The stability of this clock signal generator 2 is then equal to the stability of the auxiliary generator 9, so that the object of the invention is accomplished in a simple way.

It should be noted that in both the logic input circuit 1 and the first difference signal producer 10 only difference frequency signals are determined, so that the means for generating and processing the control signal need only be arranged for words having few bits, so that, partly for that reason these means may be of a simple construction.

In accordance with two further variations the frequency difference in the difference signal producer is, prior to the disappearance of the input signal, not generated by means of the generated clock signal but from the input signal itself.

For that purpose the second switching means 11 are arranged such that, at least during the presence of a reliable input signal, the input signal is connected to the first difference signal producer through conductor 15 and at least to the moment the input signal disappears to the clock signal generator 2. This is possible because of the fact that the second switching means 11 applies the two signals continuously to the first difference signal producer 10 which in that case comprises a second adding and subtracting device. In the first adding and subtracting device the difference between the frequencies of the input signal and the auxiliary signal is then periodically determined, which frequency difference is periodically applied to the store 13 and the difference between the frequencies of the generated clock signal and the auxiliary signal is periodically determined in the second adder and subtracting device, which frequency difference is only applied to the second difference signal producer 14.

However, the second switching arrangement may alternatively comprise a change-over switch which under the control of the control device applies during the presence of a reliable input signal the input signal to the first difference signal producer 10 and when the input signal disappears the generated clock signal to the first difference signal producer 10, which difference signal producer 10 comprises in that case only one single adding and subtracting device.

The above-described generator may partly be formed by means of a $\mu$-processor, for example a 80$\mu$-processor. This holds more specifically for the logic circuit 1, the first and second difference signal producers 10 and 14 and the control device 8, which all perform logic signal processing operations. In addition, the store 13 may form part of the memories of the $\mu$-processor.

What is claimed is:

1. A clock signal regenerator comprising a clock signal generator whose frequency is controlled by a control signal, said clock signal generator included in a control loop for synchronizing the frequency of the clock signal generated by the clock signal generator with an input signal applied to the control loop by means of a control signal derived from the frequency difference between the clock signal and the input signal, said regenerator comprising: an auxiliary signal generator for producing a fixed-frequency auxiliary signal, a first difference-signal producer connected to the auxiliary signal generator and connected to receive the generated clock signal to determine the frequency difference between the auxiliary signal and a signal which is proportional to the clock signal, a storage device connected to the first difference signal producer for storing the determined frequency difference, a second difference signal producer connected to the first difference signal producer and to the storage device to determine the difference between the frequency difference stored in the storage device and a signal produced by the first difference signal producer, which signal is proportional to the frequency difference between the auxiliary signal and the clock signal, and switching means for applying in the absence of a reliable input signal the signal produced by the second difference signal producer as a control signal to the controllable clock signal generator.

2. A clock signal regenerator as claimed in claim 1, wherein the first difference signal producer comprises a first adding and subtracting circuit to which the auxiliary signal and the generated clock signal are applied for increasing the counting position of the first adding and subtracting circuit by means of one of the signals applied thereto and for decreasing the counting position by means of the adder signal.

3. A clock signal regenerator as claimed in claim 2, wherein the switching means applies to the storage circuit the counting position of the first adding and subtracting circuit when a reliable input signal is present.

4. A clock signal regenerator as claimed in claim 3, wherein the input signal is also applied to the first difference signal producer and the switching means are connected to apply the input signal to the first adding and subtracting circuit when a reliable input signal is present and for applying the generated clock signal to the first adding and subtracting circuit in the absence of a reliable input signal.

5. A clock signal regenerator as claimed in claim 2, wherein the input signal is also applied to the first difference signal producer, and the first difference signal producer comprises a second adding and subtracting circuit to which the auxiliary signal and the input signal are applied for increasing the counting position of the second adding and subtracting circuit by means of one of the signals applied thereto and for decreasing the counting position by means of the other signal and that the first switching means is connected for applying the counting position of the second adding and subtracting circuit to the storage circuit when a reliable input signal is present.

6. A clock signal regenerator as claimed in claim 1, wherein the regenerator comprises a logic circuit to which several incoming clock pulse signals are applied and which includes means for determining the control signal, the input signal being a weighted sum of the incoming clock pulse signals.

* * * * *